(12) United States Patent
Lindner et al.

(10) Patent No.: US 9,457,552 B2
(45) Date of Patent: Oct. 4, 2016

(54) METHOD FOR DETACHING A PRODUCT SUBSTRATE OFF A CARRIER SUBSTRATE

(71) Applicant: EV Group GmbH, St. Florian (AT)

(72) Inventors: Friedrich Paul Lindner, Scharding/Inn (AT); Jurgen Burggraf, Scharding (AT)

(73) Assignee: EV Group GmbH (AT)

( * ) Notice: Subject to any disclaimer, the term of this patent is extended or adjusted under 35 U.S.C. 154(b) by 0 days.

(21) Appl. No.: 14/715,691

(22) Filed: May 19, 2015

(65) Prior Publication Data
US 2015/0251404 A1 Sep. 10, 2015

Related U.S. Application Data

(62) Division of application No. 13/641,479, filed as application No. PCT/EP2011/001556 on Mar. 29, 2011.

(30) Foreign Application Priority Data

Apr. 23, 2010 (EP) ..................................... 10004313

(51) Int. Cl.
 *B32B 38/10* (2006.01)
 *H01L 21/67* (2006.01)
 (Continued)

(52) U.S. Cl.
 CPC ............. *B32B 38/10* (2013.01); *B32B 37/025* (2013.01); *H01L 21/6715* (2013.01);
 (Continued)

(58) Field of Classification Search
 CPC ................ B32B 38/10; B32B 43/006; Y10T 156/1111; Y10T 156/1121; Y10T 156/1168; Y10T 156/1179; Y10T 156/1922; Y10T 156/1978; Y10T 156/1983; H01L 21/67346; H01L 21/68721; H01L 21/68771; H01L 2221/68386
 USPC ........ 156/703, 705, 714, 716, 754, 764, 765
 See application file for complete search history.

(56) References Cited

U.S. PATENT DOCUMENTS 3,988,196 A   10/1976   Wanesky ....................... 156/541
4,826,553 A * 5/1989   Armitage .................. B44C 1/17
                                                              156/233

(Continued)

FOREIGN PATENT DOCUMENTS

AT           502 233       4/2007   ............. H01L 21/68
CN       101632155 A       1/2010   ........... H01L 21/301

(Continued)

OTHER PUBLICATIONS

Howell W C: "The Direct Demount of Thinned GaAs Wafers to Sawing Tape", 1990, Digest of Papers(1990 U.S. Conference on GaAs Manufacturing Technology: Apr. 1-3, 1990 Bally's Reno, Reno, Nevada, 5 pages.

(Continued)

*Primary Examiner* — Philip Tucker
*Assistant Examiner* — Nickolas Harm
(74) *Attorney, Agent, or Firm* — Kusner & Jaffe (57) ABSTRACT

Device for stripping a product substrate off a carrier substrate connected to the product substrate by an bonding layer by means of a film frame, a flexible film which is connected to the film frame and which has an adhesive layer for holding the product substrate in a contacting surface section of the film, the film being connected to the film frame in an attachment section of the film which surrounds the contacting surface section, as well as a solvent reservoir formed by the film frame and the film, especially of variable volume, for holding the solvent for detaching the bonding layer, and the product substrate and the bonding layer can be accommodated in the solvent reservoir, and by delivery means for delivering the solvent into the solvent reservoir and by stripping means for stripping the product substrate off the carrier substrate.

42 Claims, 3 Drawing Sheets

(51) Int. Cl.
*B32B 37/00* (2006.01)
*B32B 43/00* (2006.01)
*H01L 21/687* (2006.01)
*H01L 21/673* (2006.01)
*B32B 38/00* (2006.01)

(52) U.S. Cl.
CPC .. *H01L 21/67092* (2013.01); *H01L 21/67132* (2013.01); *B32B 43/006* (2013.01); *B32B 2038/0052* (2013.01); *B32B 2307/546* (2013.01); *B32B 2310/0418* (2013.01); *H01L 21/67346* (2013.01); *H01L 21/68721* (2013.01); *H01L 21/68771* (2013.01); *H01L 2221/68386* (2013.01); *Y10T 156/1111* (2015.01); *Y10T 156/1168* (2015.01); *Y10T 156/1179* (2015.01); *Y10T 156/19* (2015.01); *Y10T 156/1922* (2015.01); *Y10T 156/1928* (2015.01); *Y10T 156/1978* (2015.01); *Y10T 156/1983* (2015.01)

(56) References Cited

U.S. PATENT DOCUMENTS

| | | | |
|---|---|---|---|
| 5,273,615 A | 12/1993 | Asetta et al. | 156/584 |
| 5,447,596 A | 9/1995 | Hayase | 156/584 |
| 5,688,411 A | 11/1997 | Kutsuzawa et al. | 216/92 |
| 5,800,665 A | 9/1998 | Okaniwa et al. | 156/344 |
| 6,090,687 A | 7/2000 | Merchant et al. | 438/455 |
| 6,342,434 B1 | 1/2002 | Miyamoto et al. | 438/464 |
| 6,462,415 B1 | 10/2002 | Ishiguri et al. | 257/738 |
| 6,713,880 B2 | 3/2004 | Sahara et al. | 257/783 |
| 6,792,991 B2 | 9/2004 | Thallner | 156/539 |
| 7,211,168 B2 | 5/2007 | Miyanari | 156/344 |
| 7,438,631 B2 | 10/2008 | Nagamoto et al. | 451/59 |
| 7,497,916 B2 | 3/2009 | Hayashi et al. | 156/64 |
| 7,829,152 B2 | 11/2010 | Thie et al. | 427/443.1 |
| 7,910,454 B2 | 3/2011 | Thallner | 438/455 |
| 2002/0106869 A1 | 8/2002 | Otsu et al. | 438/459 |
| 2003/0113984 A1 | 6/2003 | Okada et al. | 438/459 |
| 2004/0089397 A1 | 5/2004 | Cheng et al. | 156/67 |
| 2004/0166653 A1 | 8/2004 | Kerdiles et al. | 438/458 |
| 2004/0188861 A1 | 9/2004 | Kurimoto et al. | 257/786 |
| 2005/0173064 A1 | 8/2005 | Miyanari | 156/344 |
| 2005/0236693 A1 | 10/2005 | Kroninger et al. | 257/619 |
| 2006/0032587 A1 | 2/2006 | Hecht et al. | 156/382 |
| 2006/0199382 A1* | 9/2006 | Sugiyama | H01L 21/67132 438/670 |
| 2007/0125751 A1 | 6/2007 | Nakamura et al. | 216/83 |
| 2007/0295458 A1 | 12/2007 | Akechi | 156/510 |
| 2009/0017323 A1 | 1/2009 | Webb et al. | 428/521 |
| 2009/0218050 A1 | 9/2009 | Nakamura et al. | 156/584 |
| 2009/0305617 A1 | 12/2009 | Nakamura et al. | 451/364 |
| 2012/0000613 A1 | 1/2012 | Thallner | 156/703 |
| 2015/0053352 A1* | 2/2015 | Yoon | B32B 43/006 156/703 |

FOREIGN PATENT DOCUMENTS

| | | | |
|---|---|---|---|
| DE | 197 34 635 A1 | 2/1999 | H01L 21/58 |
| DE | 100 48 881 | 3/2002 | H01L 21/58 |
| DE | 101 08 369 | 8/2002 | H01L 21/58 |
| DE | 103 40 409 | 4/2005 | H01L 21/00 |
| DE | 10 2004 018 250 | 11/2005 | H01L 21/68 |
| DE | 10 2006 000 687 | 7/2007 | H01L 21/673 |
| EP | 1 298 713 A1 | 4/2003 | H01L 21/304 |
| EP | 2 230 683 | 9/2010 | H01L 21/00 |
| JP | 6-275717 | 9/1994 | H01L 21/78 |
| JP | 2003-338475 | 11/2003 | H01L 21/304 |
| JP | 2004-119975 | 4/2004 | H01L 21/68 |
| JP | 2004-193237 | 7/2004 | H01L 21/68 |
| JP | 2005-023205 | 1/2005 | C09J 4/00 |
| JP | 2005-093964 | 4/2005 | H01L 21/304 |
| JP | 2005-123382 | 5/2005 | H01L 21/304 |
| JP | 2005-353859 | 12/2005 | H01L 21/304 |
| JP | 2006-032506 | 2/2006 | H01L 21/68 |
| JP | 2006-059861 | 3/2006 | H01L 21/683 |
| JP | 2006-135272 | 5/2006 | H01L 21/304 |
| JP | 2006-156679 | 6/2006 | H01L 21/02 |
| JP | 2007-048920 | 2/2007 | H01L 21/301 |
| JP | 2007-53325 | 3/2007 | H01L 21/301 |
| JP | 2007-067167 | 3/2007 | H01L 21/683 |
| JP | 2008-021929 | 1/2008 | H01L 21/683 |
| JP | 2008-060255 | 3/2008 | H01L 21/304 |
| JP | 2008-109123 | 5/2008 | H01L 21/02 |
| JP | 2008-300487 A | 12/2008 | H01L 21/02 |
| JP | 2008-300490 | 12/2008 | H01L 21/683 |
| JP | 2009-182067 | 8/2009 | H01L 21/683 |
| JP | 2009-182256 | 8/2009 | H01L 21/683 |
| JP | 2009-206452 | 9/2009 | H01L 21/683 |
| JP | 2010-27720 A | 2/2010 | H01L 21/68 |
| WO | WO 2002/067295 | 8/2002 | H01L 21/00 |

OTHER PUBLICATIONS

International Search Report for International Application No. PCT/EP2011/001556, Jun. 6, 2011.

Notice of Reasons for Rejection (dated Jun. 4, 2013) issued in connection with corresponding Japanese Patent Application No. 2013-504150 (including English translation).

Notification of Reasons for Refusal (dated Mar. 12, 2014) issued in connection with corresponding Japanese Patent Application No. 2013-99954, including English translation.

Office Action issued in corresponding Japanese Patent Application No. 2013-99954, issued Mar. 31, 2014 (English-language translation included).

Office Action issued in corresponding European Patent Application No. 12 179 539.7, dated Dec. 15, 2014.

Office Action issued in connection with corresponding Chinese Patent Application No. 201310126332.X dated Mar. 20, 2015.

* cited by examiner

METHOD FOR DETACHING A PRODUCT SUBSTRATE OFF A CARRIER SUBSTRATE

RELATED APPLICATIONS

The present application is a divisional of U.S. application Ser. No. 13/641,479, filed Oct. 16, 2012, which is a U.S. National Stage Application of International Application No. PCT/EP11/01556, filed Mar. 29, 2011, which claims priority from European Patent Application No. 10004313.2, filed Apr. 23, 2010, said patent applications hereby fully incorporated herein by reference.

FIELD OF THE INVENTION

The invention relates to a device and a method for stripping a product substrate off a carrier.

BACKGROUND OF THE INVENTION

The back-grinding of product substrates is often necessary in the semiconductor industry and can take place mechanically and/or chemically. For purposes of back-grinding in general the product substrates are temporarily fixed on a carrier, there being various methods for the fixing. The carrier material can be for example films, glass substrates or silicon wafers.

Depending on the carrier materials used and the bonding layer used between the carrier and the product substrate, different methods for dissolving or destroying the bonding layer are known, such as for example the use of UV light, laser beams, the action of temperature, or solvents.

Stripping increasingly constitutes one of the most critical process steps since thin substrates with substrate thicknesses of a few microns easily break during stripping/peeling or are damaged by the forces which are necessary for the stripping process.

Moreover thin substrates have hardly any stability of shape or none at all and typically curl without support material. During handling of back-ground wafers therefore fixing and support of the wafers are essentially indispensable.

Therefore the object of this invention is to devise a device and a method to detach a product substrate from a carrier as nondestructively and easily as possible.

This object is achieved with the features of the claims. Advantageous developments of the invention are given in the dependent claims. The framework of the invention also encompasses all combinations of at least two of the features given in the specification, the claims, and/or the figures. In the specified value ranges, values which lie within the indicated limits will also be disclosed as boundary values and they are to be claimed in any combination.

SUMMARY OF THE INVENTION

The invention is based on the idea of developing a generic device and a generic method by solvent being delivered to a solvent reservoir which is formed by the film frame and the film attached to it. Due to the elasticity or flexibility of the film which is mounted on the film frame it is at the same time possible to make the solvent tank of variable volume and the elasticity or flexibility of a film is moreover used to carefully strip the product substrate starting from the edge of the product substrate. In this way the product substrate is immediately available for other process steps directly after separation and is protected by the film and the film frame. Many process steps can be carried out directly on the product substrate mounted on the film frame.

A product substrate is defined as a product substrate, for example a semiconductor wafer, which is conventionally thinned to a thickness between 0.5 μm and 250 μm, the trend being toward thinner and thinner product substrates. This invention works especially effectively with product substrates which themselves have a flexibility similar to the film mounted on the film frame. The product substrate in the device as claimed in the invention and the method as claimed in the invention is peeled off the carrier substrate, especially proceeding concentrically from the periphery of the product substrate.

The carrier is for example a carrier substrate with a thickness between 50 μm and 5000 μm, especially between 500 μm and 1000 μm.

The bonding layer can be an adhesive, for example a soluble adhesive, especially a thermoplastic, which is applied for example selectively in the edge region of the carrier-product substrate combination, especially in an edge zone from 0.1 to 20 mm. Alternatively the adhesive can be applied over the entire surface, and the adhesive force can be reduced in the center by an adhesion-reducing layer, for example a fluoropolymer, preferably teflon.

A chuck is especially well suited as the holding means, especially a spinner chuck for holding the carrier substrate, especially by means of negative pressure, for example on suction paths, holes or suction cups. Alternatively, mechanical holding, for example by lateral clamps, is conceivable. Holding takes place electrostatically in another alternative configuration.

The stripping means encompass the film mounted on the film frame and a film frame holder which applies a force and which holds the film frame.

In one advantageous embodiment of the invention it is provided that the solvent is made to work essentially without heating. The solvent is preferably used at ambient temperature. In this way it is possible to omit any heating means.

By the solvent being intended for at least partially detaching the connection between the carrier substrate and the product substrate caused by the bonding layer, stripping by the stripping means is advantageously clearly facilitated.

Because the solvent comprises especially a fluid agent which selectively dissolves the bonding layer for at least partial detachment of the bonding layer, for bonding layers encompassing different adhesives it becomes possible to dissolve a certain bonding layer in a controlled manner or in defined regions. Chemical dissolution of the bonding layer is especially protective of the product substrate and with the corresponding material choice, dissolution can also take place very quickly, especially when only edge regions of the product substrate are provided with an bonding layer, so that the solvent can act very quickly from the side. In this way perforations in the carrier substrate and/or product substrate can be omitted.

To the extent the solvent reservoir is made such that the solvent acts at least at the start of detachment of the bonding layer, especially solely in the region of the periphery of the product substrate, action on the product substrate and/or carrier substrate from the top and/or bottom, especially the inner region of the product substrate which lies within the side edge, can be omitted.

In another configuration of the invention it is provided that the stripping means are made to cause a force $F_s$ which acts on the carrier substrate and a force $F_f$ which acts on the film frame and which is directed against the force $F_s$. In this way stripping is effected in a manner which is simple and especially protective by the film. The force $F_F$ acts on the periphery of the film frame, especially at at least two locations on the film frame which are distributed over the periphery, and the forces $F_{f1}$ and $F_{f2}$ can be controlled differently in one advantageous embodiment in order to strip the product substrate from the side with the greater force $F_f$.

Here it is especially advantageous if the film can be clamped, especially by the force Fs and force Ff in a stripping section which lies between the contacting surface section and the attachment section. In this way stripping is carefully effected on the periphery of the product substrate. Detachment by the solvent and stripping by the forces $F_s$ and $F_f$ mutually support one another.

According to one advantageous embodiment of the invention it is provided that there is a vibration generator which acts on the solvent and/or the bonding layer, which adjoins especially the film, and/or which can be placed in the solvent in the solvent reservoir. "Can be placed" comprises both surface contact and also at least partial immersion. This supports detachment by the solvent and accelerates the detachment process at least by a factor of 2, with an optimized configuration by a factor of 5, even more preferably by a factor of 10 to 50. Preferably the vibration generator acts by ultrasonic waves, especially in the region of the contacting surface section.

In another advantageous embodiment the solvent reservoir is made trough-shaped, by which stripping of the product substrate can be achieved with a minimum solvent consumption.

Other advantages, features and details of the invention will become apparent from the following description of preferred exemplary embodiments and using the drawings.

DETAILED DESCRIPTION OF THE PREFERRED EMBODIMENTS

In the figures the same components and components with the same function are identified with the same reference number.

Figure 1A:
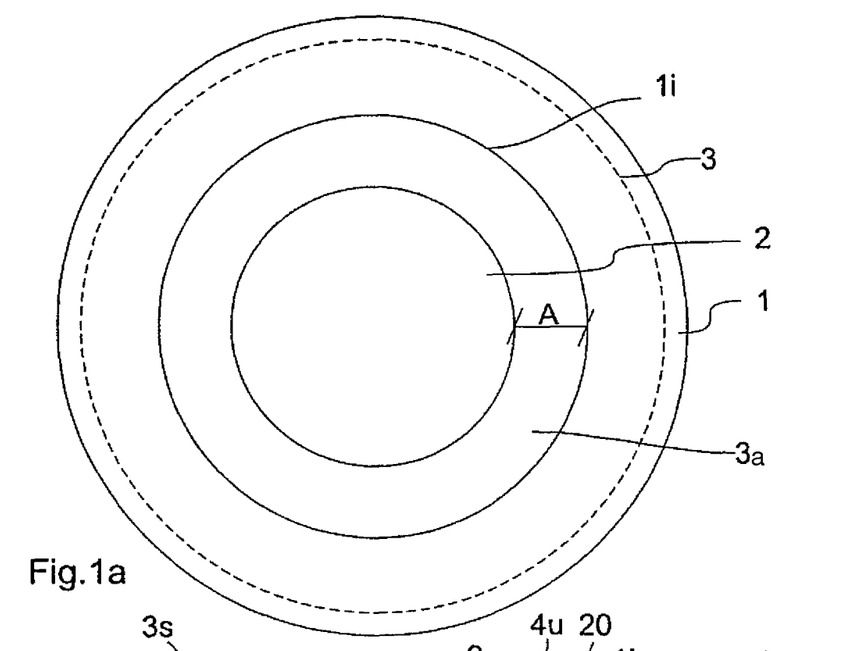
FIG. 1a shows a schematic top view of a substrate combination consisting of the product substrate, the carrier substrate and the bonding layer on a film frame.
Figure 1B:
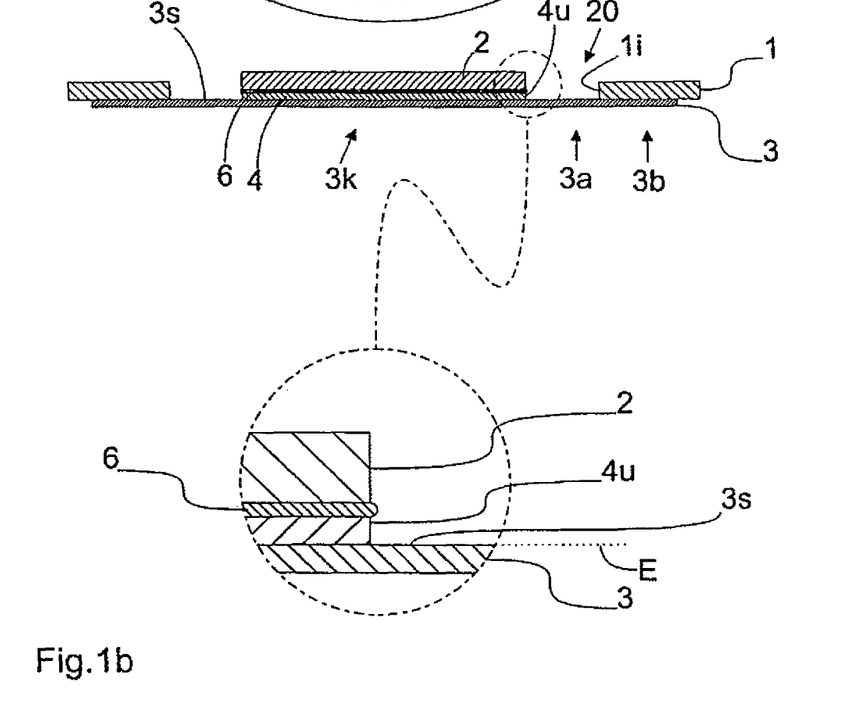
FIG. 1b shows a schematic side view to FIG. 1a with a detailed view.

FIG. 1a shows a film frame 1 which is round in this embodiment at least on the inner periphery 1i, on whose bottom according to the sectional view shown in FIG. 1b a film 3 is cemented with its adhesive layer 3s concentrically to the film frame 1. With a radial distance A to the inner periphery 1i of the film frame 1, within the film frame 1 the product substrate-carrier substrate combination is cemented on a adhesive layer 3s of the film 3 concentrically to the film frame 1. The product substrate-carrier substrate combination consists of a product substrate 4 which adheres to the film 3, a carrier substrate 2 and a bonding layer 6 which connects the product substrate 4 and the carrier substrate 2. The diameters of the product substrate 4 and of the carrier substrate 2 are essentially identical, while the thickness of the product substrate 4 is less than the thickness of the carrier substrate 2.

The film 3 consists of an attachment section 3b which has the shape of a circular ring in this case and in which the film 3 is fixed to the film frame 1. Furthermore, the film 3 consists of a contacting surface section 3k in which the product substrate 4 can be fixed on the adhesive layer 3s of the film 3. Between the attachment section 3b and the contacting surface section 3k there is a stripping section 3a which is located especially concentrically to the attachment section 3b and the contacting surface section 3k, and which need not have a cementing function, to which however a function which is critical as claimed in the invention is attached. The stripping section 3a thus extends from the periphery 4u of the product substrate 4 to the inner periphery 1i of the film frame 1, here labeled the radial distance A. The ratio between the thickness D of the film frame 1 and the distance A is advantageously at least 1:2 to 1:50, especially 1:5 to 1:25.

In the initial position shown in FIG. 1b, the side of the product substrate 4 which makes contact with the film 3 and the side of the film frame 1 which makes contact with the film 3 are arranged flush and in one plane E. The parts shown in FIGS. 1a and 1b are assembled on a known film frame mounter.

The film 3 and the inner periphery 1i of the film frame 1 form a trough-shaped solvent reservoir 20 in which the product substrate-carrier substrate can be arranged as described above.

Figure 2:
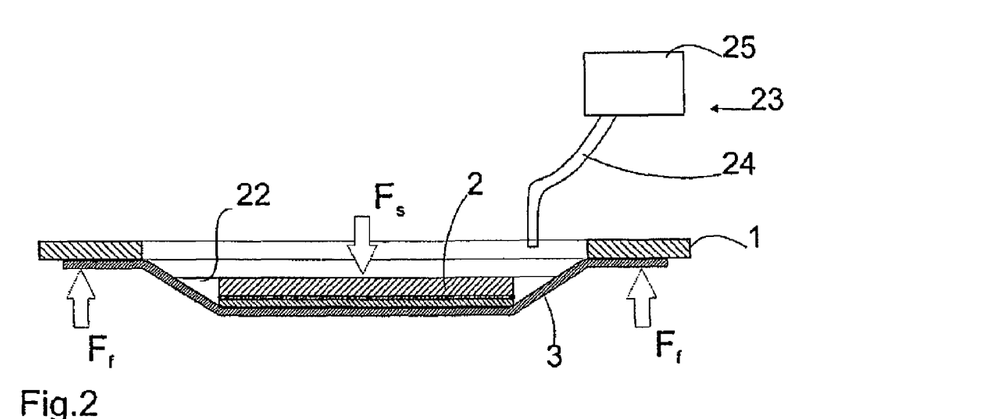
FIG. 2 shows a schematic according to FIG. 2 when the solvent is being delivered.

According to the method step shown in FIG. 2 the solvent 22 can be delivered into the solvent reservoir 20 by delivery means 23. The delivery means 23 here consists of a line 24 and a solvent storage 25 which can be triggered from a central unit in order to deliver the solvent 22 into the solvent reservoir 20.

As FIG. 2 shows, the solvent reservoir 20 is of variable volume due to the film 3 which is elastic at least in the stripping section 3a by a force $F_s$ acting on the carrier substrate 2 downwardly and a force $F_f$ acting on the film frame 1 upwardly. Application of the force is likewise controlled by a central unit.

Increasing the volume of the storage means reservoir prevents the solvent 22 running over the edge of the film frame 1 and at the same time prompt distribution or delivery of the solvent 22 is enabled.

Figure 3:
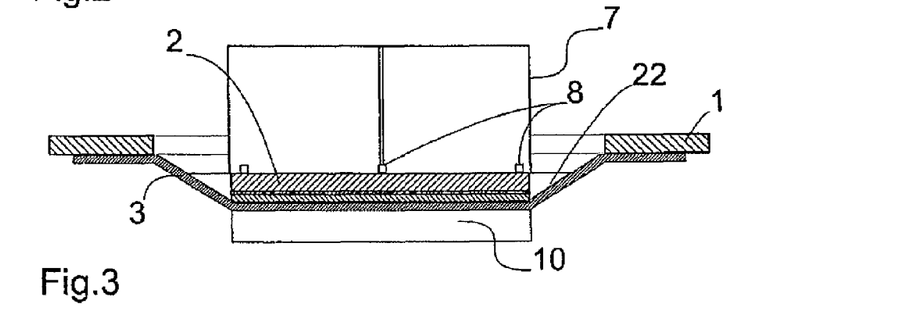
FIG. 3 shows a schematic of the method step of detaching the bonding layer.

The force $F_s$ as shown in FIG. 3 is transferred by way of the carrier substrate holder 7 for holding the carrier substrate 2, fixing of the carrier substrate 2 on the carrier substrate holder 7 taking place by vacuum paths 8 which have been machined into the surface of the carrier substrate holder 7 and via a vacuum means which is connected to them and which is not shown.

On the opposite side of the film 3 to the product substrate 4 there can be an acoustic wave generator 10, especially for producing ultrasonic waves, by which ultrasonic waves can be transmitted onto the product substrate 4, but especially onto the bonding layer 6 and the solvent 22, since in this way the process of detachment is greatly accelerated, especially by a factor of 2, preferably by a factor of 5, even more preferably by a factor of 10 to 50.

Figure 5:
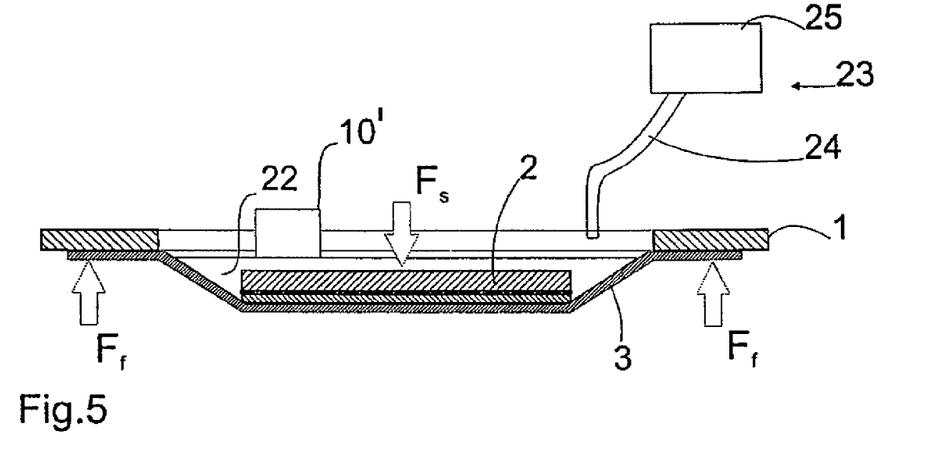
FIG. 5 shows a schematic of one alternative method step of stripping the product substrate off the carrier substrate as claimed in the invention.

According to one alternative embodiment shown in FIG. 5, the acoustic wave generator 10' is in contact at least with the surface of the fluid solvent 22, but preferably is at least partially immersed in it. In this way the acoustic waves can be transmitted directly onto the solvent 22 and from the solvent 22 onto the bonding layer 6.

The force $F_f$ acting on the film frame 1, as shown in FIG. 3, can act uniformly distributed as a superficial force on the film frame 1 so that a change in the volume of the solvent reservoir 20 can be caused by way of deformation of the film 3 in the stripping section 3a.

Figure 4:
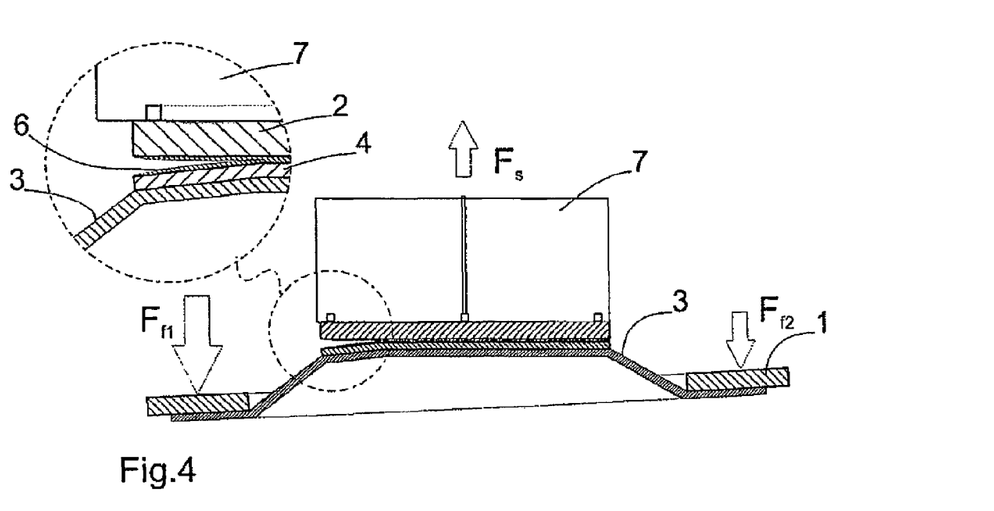
FIG. 4 shows a schematic of the method step of stripping of the product substrate off the carrier substrate as claimed in the invention.

As shown in FIG. 4, stripping of the product substrate 2 from the carrier substrate 4 takes place in reverse, by the forces $F_s$ and $F_f$ or $F_{s1}$ and $F_{s2}$ being pointed in the opposite direction, the force $F_{f1}$ in the embodiment shown here being set to be greater than the force $F_{f2}$ in order to have the stripping of the product substrate 4 start carefully first from the edge side according to the enlargement shown in FIG. 4.

The force $F_{f1}$ or several forces $F_{f1}$, $F_{f2}$ to $F_{fn}$ can be delivered in spots distributed on the periphery of the film frame 1 or can be delivered distributed by a film frame holder.

To the extent the forces $F_{f1}$, $F_{f2}$ and/or $F_{fn}$ are made differently, the holding means for applying the force to the film frame 1 must be made to allow tilting of the film frame 1.

Between the process step of detachment by the solvent 22 shown in FIG. 3 and the method step of stripping by opposing forces $F_s$, $F_{f1}$, $F_{f2}$, $F_{fn}$ shown in FIG. 4 there can be one method step by which the solvent 22 is removed from the solvent reservoir 20, especially by suction.

DESCRIPTION OF THE REFERENCE NUMERALS 1 film frame
2 carrier substrate
3 film
3a stripping section
3b attachment section
3k contacting surface section
3s adhesive layer
4 product substrate
4u periphery
6 bonding layer
7 carrier substrate holder
8 vacuum paths
10, 10' acoustic wave generator
20 solvent reservoir
22 solvent
23 delivery means
24 line
25 solvent storage
$F_s$, $F_{f1}$, $F_{f2}$ ... $F_{fn}$ force
Fs force Having described the invention, the following is claimed:

1. Method for stripping a product substrate off a carrier substrate connected to the product substrate by a bonding layer therebetween, wherein said carrier substrate connected to the product substrate by a bonding layer forms a carrier-product substrate combination, said method comprising:
   connecting a flexible film to a film frame to form a solvent reservoir that receives a solvent for dissolving the bonding layer;
   mounting the carrier-product substrate combination to the flexible film by fixing the product substrate to a contacting surface section of the flexible film using an adhesive;
   receiving at least the product substrate and the bonding layer of the carrier-product substrate combination into the solvent reservoir;
   delivering the solvent into the solvent reservoir; and
   at least partially dissolving the bonding layer between the carrier substrate and the product substrate by exposing the bonding layer of the carrier-product substrate combination to the solvent received by the solvent reservoir,
   wherein said bonding layer connecting the product substrate to the carrier substrate is comprised of a plurality of different adhesive layers.

2. Method as claimed in claim 1, wherein, at least at the start of dissolving the bonding layer, the solvent acts solely in a region of a periphery of the product substrate.

3. Method as claimed in claim 1, wherein the step of receiving at least the product substrate and the bonding layer of the carrier-product substrate combination into the solvent reservoir includes:
   (i) applying a force $F_s$ acting on the carrier substrate that is transferred to the flexible film, and
   (ii) applying a force $F_f$ acting on the film frame, said force $F_1$ directed against the force F.

4. Method as claimed in claim 1, wherein the step of at least partially dissolving the bonding layer includes dissolving the bonding layer in the solvent reservoir starting from a periphery of the product substrate.

5. Method as claimed in claim 1, wherein said method further comprises:
   detaching the product substrate from the carrier substrate after delivering of the solvent into the solvent reservoir and at least partially dissolving the bonding layer.

6. Method as claimed in claim 5, wherein detaching the product substrate from the carrier substrate is caused by a force $F_s$ acting on said carrier substrate and a force $F_f$ acting on said film frame and which is directed against the force $F_s$.

7. Method as claimed in claim 5, wherein detaching the product substrate from the carrier substrate takes place concentrically from a periphery of said product substrate to a center of said product substrate.

8. Method as claimed in claim 1, wherein the solvent comprises a fluid that selectively dissolves the bonding layer, for at least partial detachment of the bonding layer.

9. Method as claimed in claim 1, wherein the bonding layer is dissolved in defined regions.

10. Method as claimed in claim 1, wherein said bonding layer is comprised of a plurality of bonding layers, said method including selectively dissolving a specific bonding layer of the plurality of bonding layers.

11. Method as claimed in claim 1, wherein a plurality of bonding layers connect the carrier substrate to the product substrate, wherein said method further comprises selectively dissolving more than one bonding layer.

12. Method as claimed in claim 1, wherein the solvent acts solely in the region of the periphery of the product substrate.

13. Method for stripping a product substrate off a carrier substrate connected to the product substrate by a bonding layer, said method comprising:
   receiving the product substrate on a flexible film having an adhesive layer, said adhesive layer holding the product substrate on a contacting surface section of the flexible film;
   connecting an attachment section of the flexible film to the film frame, said attachment section surrounding the contacting surface section; and
   detaching the product substrate from the carrier substrate, wherein the detaching step includes:

applying a force $F_s$ that acts on the flexible film, and applying a force $F_f$ that acts on the film frame, said force $F_f$ directed against the force $F_s$, wherein said bonding layer connecting the product substrate to the carrier substrate is comprised of a plurality of different adhesive layers.

14. Method as claimed in claim 13, wherein said product substrate is detached from the carrier substrate concentrically from a periphery of the product substrate to a center of the product substrate.

15. Method as claimed in claim 13, wherein the detaching step includes:

exposing at least a portion of the bonding layer to a solvent; and at least partially dissolving the bonding layer.

16. Method as claimed in claim 15, wherein said bonding layer is comprised of a plurality of different bonding layers, each of said plurality of different bonding layers selectively dissolved by a solvent having a different fluid agent.

17. Method for stripping a product substrate off a carrier substrate fixed to the product substrate by a bonding layer therebetween, wherein said carrier substrate connected to the product substrate by a bonding layer forms a carrier-product substrate combination, said method comprising:

mounting the product substrate of the carrier-product substrate combination to a contacting surface section of a flexible film, said contacting surface section including an adhesive layer;

fixing a film frame to an attachment surface section of the flexible film, wherein the attachment surface section is disposed at the outer periphery of the contacting surface section;

receiving the bonding layer in a solvent reservoir defined by the film frame and the flexible film, said solvent reservoir receiving a solvent for dissolving at least a portion of the bonding layer;

applying a force $F_s$ to the carrier substrate that is transferred to the flexible film;

applying at least one force $F_f$ to the film frame, said at least one force $F_f$ directed against the force $F_s$; and tilting the film frame, wherein applying the force $F_s$ and the at least one force $F_f$ deforms at least a stripping section of the flexible film that is disposed between the contacting surface section and the attachment surface section, the flexible film being elastic at least in the stripping section.

18. Method as claimed in claim 17, wherein the method further comprises engaging a carrier substrate holder with the carrier substrate to apply the force $F_s$ to the carrier substrate.

19. Method as claimed in claim 17, wherein the method further comprises engaging a film frame holder with the film frame to apply the at least one force $F_f$ to the film frame.

20. Method as claimed in claim 17, wherein applying the force $F_s$ and the at least one force $F_f$ to deform at least the stripping section of the flexible film, varies the volume of the solvent reservoir.

21. Method as claimed in claim 17, wherein the method further comprises:

producing acoustic waves that are transmitted to at least one of: (i) the solvent received in the solvent reservoir, and (ii) the bonding layer.

22. Method as claimed in claim 21, wherein the method further comprises:

producing said acoustic waves using a vibration generator.

23. Method as claimed in claim 17, wherein said solvent reservoir is trough-shaped.

24. Method as claimed in claim 17, wherein the method further comprises:

dissolving the bonding layer from a periphery of the product substrate using the solvent received in the solvent reservoir.

25. Method as claimed in claim 17, wherein applying the force $F_s$ and the at least one force $F_f$ to deform at least the stripping section of the flexible film, moves the contacting surface section of the flexible film to a different plane than the attachment surface section of the flexible film.

26. Method as claimed in claim 17, wherein the at least one force $F_f$ is uniformly distributed on the film frame.

27. Method as claimed in claim 17, wherein the at least one force $F_1$ includes a first force $F_{f1}$ applied to the film frame and a second force $F_{f2}$ applied to the film frame, wherein the first force $F_{f1}$ is applied at a first location of the film frame and the second force $F_{f2}$ is applied at a second location of the film frame, the first force $F_{f1}$ being greater than the second force $F_{f2}$ to strip the product substrate from the carrier substrate starting at a peripheral edge of the product substrate.

28. Method as claimed in claim 17, wherein the at least one force $F_f$ includes a plurality of different forces $F_{f1}$, $F_{f2}$ to $F_{fn}$ applied to the film frame, wherein each of said plurality of different forces $F_{f1}$ $F_{f2}$ to $F_{fn}$ is applied at different locations of the film frame to strip the product substrate from the carrier substrate concentrically from the periphery of the product substrate to a center of the product substrate.

29. Method as claimed in claim 17, wherein applying the force $F_s$ and the at least one force $F_f$ to deform at least the stripping section of the flexible film, increases a volume of the solvent reservoir to increase capacity of the solvent reservoir to receive the solvent.

30. Method as claimed in claim 17, wherein applying the force F, and the at least one force $F_f$ to deform at least the stripping section of the flexible film, strips the product substrate from the carrier substrate.

31. Method as claimed in claim 17, wherein said method further comprises:

applying the force $F_s$ and the at least one force $F_f$ to deform at least the stripping section of the flexible film, in first and second operating modes, wherein in the first operating mode the contacting surface section of the flexible film is moved in a first direction, and in the second operating mode the contacting surface section of the flexible film is moved in a second direction that is opposite of the first direction.

32. Method as claimed in claim 17, wherein applying the force $F_s$ and the at least one force $F_f$ to deform at least the stripping section of the flexible film, moves the flexible film between (i) an initial position, wherein the contacting surface section and the attachment surface section are substantially in the same plane, (ii) a detachment position, wherein the contacting surface section is located in a plane below the attachment surface section, and (iii) a stripping position, wherein the contacting surface section is located in a plane above the attachment surface section.

33. Method for stripping a product substrate off a carrier substrate connected to the product substrate by a bonding layer therebetween, wherein said carrier substrate connected to the product substrate by a bonding layer forms a carrier-product substrate combination, said method comprising:

connecting a flexible film to a film frame to form a solvent reservoir that receives a solvent for dissolving the bonding layer;

mounting the carrier-product substrate combination to the flexible film by fixing the product substrate to a contacting surface section of the flexible film using an adhesive;

receiving at least the product substrate and the bonding layer of the carrier-product substrate combination into the solvent reservoir;

delivering the solvent into the solvent reservoir;

at least partially dissolving the bonding layer between the carrier substrate and the product substrate by exposing the bonding layer of the carrier-product substrate combination to the solvent received by the solvent reservoir; and detaching the product substrate from the carrier substrate after delivering of the solvent into the solvent reservoir and at least partially dissolving the bonding layer, wherein detaching the product substrate from the carrier substrate takes place concentrically from a periphery of said product substrate to a center of said product substrate.

34. Method for stripping a product substrate off a carrier substrate connected to the product substrate by a bonding layer therebetween, wherein said carrier substrate connected to the product substrate by a bonding layer forms a carrier-product substrate combination, said method comprising:

connecting a flexible film to a film frame to form a solvent reservoir that receives a solvent for dissolving the bonding layer;

mounting the carrier-product substrate combination to the flexible film by fixing the product substrate to a contacting surface section of the flexible film using an adhesive;

receiving at least the product substrate and the bonding layer of the carrier-product substrate combination into the solvent reservoir;

delivering the solvent into the solvent reservoir; and at least partially dissolving the bonding layer between the carrier substrate and the product substrate by exposing the bonding layer of the carrier-product substrate combination to the solvent received by the solvent reservoir, wherein said bonding layer is comprised of a plurality of bonding layers, said method including selectively dissolving a specific bonding layer of the plurality of bonding layers.

35. Method for stripping a product substrate off a carrier substrate connected to the product substrate by a bonding layer therebetween, wherein said carrier substrate connected to the product substrate by a bonding layer forms a carrier-product substrate combination, said method comprising:

connecting a flexible film to a film frame to form a solvent reservoir that receives a solvent for dissolving the bonding layer;

mounting the carrier-product substrate combination to the flexible film by fixing the product substrate to a contacting surface section of the flexible film using an adhesive;

receiving at least the product substrate and the bonding layer of the carrier-product substrate combination into the solvent reservoir;

delivering the solvent into the solvent reservoir; and at least partially dissolving the bonding layer between the carrier substrate and the product substrate by exposing the bonding layer of the carrier-product substrate combination to the solvent received by the solvent reservoir, wherein a plurality of bonding layers connect the carrier substrate to the product substrate, said method including selectively dissolving more than one bonding layer.

36. Method for stripping a product substrate off a carrier substrate connected to the product substrate by a bonding layer, said method comprising:

receiving the product substrate on a flexible film having an adhesive layer, said adhesive layer holding the product substrate on a contacting surface section of the flexible film;

connecting an attachment section of the flexible film to the film frame, said attachment section surrounding the contacting surface section; and detaching the product substrate from the carrier substrate, wherein the detaching step includes:

applying a force $F_s$ that acts on the flexible film, and applying a force $F_f$ that acts on the film frame, said force $F_f$ directed against the force $F_s$, wherein said product substrate is detached from the carrier substrate concentrically from a periphery of the product substrate to a center of the product substrate.

37. Method for stripping a product substrate off a carrier substrate connected to the product substrate by a bonding layer, said method comprising:

receiving the product substrate on a flexible film having an adhesive layer, said adhesive layer holding the product substrate on a contacting surface section of the flexible film;

connecting an attachment section of the flexible film to the film frame, said attachment section surrounding the contacting surface section; and detaching the product substrate from the carrier substrate, wherein the detaching step includes:

applying a force $F_s$ that acts on the flexible film, applying a force $F_f$ that acts on the film frame, said force $F_f$ directed against the force $F_s$, exposing at least a portion of the bonding layer to a solvent, and at least partially dissolving the bonding layer, wherein said bonding layer is comprised of a plurality of different bonding layers, each of said plurality of different bonding layers selectively dissolved by a solvent having a different fluid agent.

38. Method for stripping a product substrate off a carrier substrate fixed to the product substrate by a bonding layer therebetween, wherein said carrier substrate connected to the product substrate by a bonding layer forms a carrier-product substrate combination, said method comprising:

mounting the product substrate of the carrier-product substrate combination to a contacting surface section of a flexible film, said contacting surface section including an adhesive layer;

fixing a film frame to an attachment surface section of the flexible film, wherein the attachment surface section is disposed at the outer periphery of the contacting surface section;

receiving the bonding layer in a solvent reservoir defined by the film frame and the flexible film, said solvent reservoir receiving a solvent for dissolving at least a portion of the bonding layer;

applying a force $F_s$ to the carrier substrate that is transferred to the flexible film; and applying at least one force $F_f$ to the film frame, said at least one force $F_f$ directed against the force $F_s$, wherein applying the force $F_s$ and the at least one force $F_f$ deforms at least a stripping section of the flexible film that is disposed between the contacting surface section and the attachment surface section, the flexible film being elastic at least in the stripping section, and wherein the at least one force $F_f$ includes a first force $F_{f1}$ applied to the film frame and a second force $F_{f2}$ applied to the film frame, wherein the first force $F_{f1}$ is applied at a first location of the film frame and the second force $F_{f2}$ is applied at a second location of the film frame, the first force $F_{f1}$ being greater than the second force $F_{f2}$ to strip the product substrate from the carrier substrate starting at a peripheral edge of the product substrate.

39. Method for stripping a product substrate off a carrier substrate fixed to the product substrate by a bonding layer therebetween, wherein said carrier substrate connected to the product substrate by a bonding layer forms a carrier-product substrate combination, said method comprising:

mounting the product substrate of the carrier-product substrate combination to a contacting surface section of a flexible film, said contacting surface section including an adhesive layer;

fixing a film frame to an attachment surface section of the flexible film, wherein the attachment surface section is disposed at the outer periphery of the contacting surface section;

receiving the bonding layer in a solvent reservoir defined by the film frame and the flexible film, said solvent reservoir receiving a solvent for dissolving at least a portion of the bonding layer;

applying a force $F_s$ to the carrier substrate that is transferred to the flexible film; and applying at least one force $F_f$ to the film frame, said at least one force $F_f$ directed against the force $F_s$, wherein applying the force $F_s$ and the at least one force $F_f$ deforms at least a stripping section of the flexible film that is disposed between the contacting surface section and the attachment surface section, the flexible film being elastic at least in the stripping section, and wherein the at least one force $F_f$ includes a plurality of different forces $F_{f1}$, $F_{f2}$ to $F_{fn}$ applied to the film frame, each of said plurality of different forces $F_{f1}$, $F_{f2}$ to $F_{fn}$ applied at different locations of the film frame to strip the product substrate from the carrier substrate concentrically from the periphery of the product substrate to a center of the product substrate.

40. Method for stripping a product substrate off a carrier substrate fixed to the product substrate by a bonding layer therebetween, wherein said carrier substrate connected to the product substrate by a bonding layer forms a carrier-product substrate combination, said method comprising:

mounting the product substrate of the carrier-product substrate combination to a contacting surface section of a flexible film, said contacting surface section including an adhesive layer;

fixing a film frame to an attachment surface section of the flexible film, wherein the attachment surface section is disposed at the outer periphery of the contacting surface section;

receiving the bonding layer in a solvent reservoir defined by the film frame and the flexible film, said solvent reservoir receiving a solvent for dissolving at least a portion of the bonding layer;

applying a force $F_s$ to the carrier substrate that is transferred to the flexible film; and applying at least one force $F_f$ to the film frame, said at least one force $F_f$ directed against the force $F_s$, wherein applying the force $F_s$ and the at least one force $F_f$ deforms at least a stripping section of the flexible film that is disposed between the contacting surface section and the attachment surface section, the flexible film being elastic at least in the stripping section, and wherein applying the force $F_s$ and the at least one force $F_f$ to deform at least the stripping section of the flexible film, increases a volume of the solvent reservoir to increase capacity of the solvent reservoir to receive the solvent.

41. Method for stripping a product substrate off a carrier substrate fixed to the product substrate by a bonding layer therebetween, wherein said carrier substrate connected to the product substrate by a bonding layer forms a carrier-product substrate combination, said method comprising:

mounting the product substrate of the carrier-product substrate combination to a contacting surface section of a flexible film, said contacting surface section including an adhesive layer;

fixing a film frame to an attachment surface section of the flexible film, wherein the attachment surface section is disposed at the outer periphery of the contacting surface section;

receiving the bonding layer in a solvent reservoir defined by the film frame and the flexible film, said solvent reservoir receiving a solvent for dissolving at least a portion of the bonding layer;

applying a force $F_s$ to the carrier substrate that is transferred to the flexible film; and applying at least one force $F_f$ to the film frame, said at least one force $F_f$ directed against the force $F_s$, wherein applying the force $F_s$ and the at least one force $F_f$ deforms at least a stripping section of the flexible film that is disposed between the contacting surface section and the attachment surface section, the flexible film being elastic at least in the stripping section, and wherein the force $F_s$ and the at least one force $F_f$ are applied to deform at least the stripping section of the flexible film, in first and second operating modes, wherein in the first operating mode the contacting surface section of the flexible film is moved in a first direction, and in the second operating mode the contacting surface section of the flexible film is moved in a second direction that is opposite of the first direction.

42. Method for stripping a product substrate off a carrier substrate fixed to the product substrate by a bonding layer therebetween, wherein said carrier substrate connected to the product substrate by a bonding layer forms a carrier-product substrate combination, said method comprising:

mounting the product substrate of the carrier-product substrate combination to a contacting surface section of a flexible film, said contacting surface section including an adhesive layer;

fixing a film frame to an attachment surface section of the flexible film, wherein the attachment surface section is disposed at the outer periphery of the contacting surface section;

receiving the bonding layer in a solvent reservoir defined by the film frame and the flexible film, said solvent reservoir receiving a solvent for dissolving at least a portion of the bonding layer;

applying a force $F_s$ to the carrier substrate that is transferred to the flexible film; and applying at least one force $F_f$ to the film frame, said at least one force $F_f$ directed against the force $F_s$, wherein applying the force $F_s$ and the at least one force $F_f$ deforms at least a stripping section of the flexible film that is disposed between the contacting surface section and the attachment surface section, the flexible film being elastic at least in the stripping section, and wherein applying the force $F_s$ and the at least one force $F_f$ to deform at least the stripping section of the flexible film, moves the flexible film between (i) an initial position, wherein the contacting surface section and the attachment surface section are substantially in the same plane, (ii) a detachment position, wherein the contacting surface section is located in a plane below the attachment surface section, and (iii) a stripping position, wherein the contacting surface section is located in a plane above the attachment surface section.

* * * * *